US010921413B2

(12) United States Patent
Yoshii et al.

(10) Patent No.: US 10,921,413 B2
(45) Date of Patent: Feb. 16, 2021

(54) HIGH-FREQUENCY MAGNETIC FIELD GENERATING DEVICE

(71) Applicant: SUMIDA CORPORATION, Tokyo (JP)

(72) Inventors: Yoshiharu Yoshii, Natori (JP); Masaki Saito, Nagano (JP); Norikazu Mizuochi, Kyoto (JP); Kan Hayashi, Kyoto (JP)

(73) Assignee: SUMIDA CORPORATION, Tokyo (JP)

( * ) Notice: Subject to any disclaimer, the term of this patent is extended or adjusted under 35 U.S.C. 154(b) by 231 days.

(21) Appl. No.: 16/103,356

(22) Filed: Aug. 14, 2018

(65) Prior Publication Data

US 2019/0079157 A1 Mar. 14, 2019

(30) Foreign Application Priority Data

Sep. 12, 2017 (JP) .................................. 2017-174895
Mar. 5, 2018 (JP) .................................. 2018-038182

(51) Int. Cl.
| G01R 33/60 | (2006.01) |
| G01R 33/34 | (2006.01) |
| G01R 33/032 | (2006.01) |
| G01R 33/12 | (2006.01) |
| G01N 24/10 | (2006.01) |
| G01R 33/32 | (2006.01) |
| G01R 33/36 | (2006.01) |

(52) U.S. Cl.
CPC ............ *G01R 33/60* (2013.01); *G01N 24/10* (2013.01); *G01R 33/032* (2013.01); *G01R 33/1284* (2013.01); *G01R 33/323* (2013.01); *G01R 33/34* (2013.01); *G01R 33/34061* (2013.01); *G01R 33/36* (2013.01)

(58) Field of Classification Search
None
See application file for complete search history.

(56) References Cited

U.S. PATENT DOCUMENTS

2013/0134979 A1* 5/2013 McDougall ...... G01R 33/34046
324/322

FOREIGN PATENT DOCUMENTS

JP 2012-110489 A 6/2012

OTHER PUBLICATIONS

S. M. Wright et al, Simple Approaches to Current Control for Transmit Array Elements at 7 Tesla Proc. Intl. Soc. Mag. Reson. Med. 19 (2011).

(Continued)

*Primary Examiner* — Douglas X Rodriguez
(74) *Attorney, Agent, or Firm* — Cowan, Liebowitz & Latman, P.C.; Mark Montague

(57) ABSTRACT

A high-frequency magnetic field generating device includes two coils arranged with a predetermined gap in parallel with each other, the two coils (a) in between which electron spin resonance material is arranged or (b) arranged at one side from electron spin resonance material; a high-frequency power supply that generates microwave current that flows in the two coils; and a transmission line part connected to the two coils, that sets a current distribution so as to locate the two coils at positions other than a node of a stationary wave.

4 Claims, 21 Drawing Sheets

(56) References Cited

OTHER PUBLICATIONS

Jiaming Cui et al, A Switched-Mode Breast Coil for 7T MRI Using Forced-Current Excitation IEEE Transactions on Biomedical Engineering, vol. 62, No. 7, Jul. 2015.

Kento Sasaki et al., Broadband, large-area microwave antenna for optically-detected magnetic resonance of nitrogen-vacancy centers in diamond, Review of Scientific Instruments, May 26, 2016, p. 3904, vol. 87, Issue 05, American Institute of Physics, United States of America.

* cited by examiner

HIGH-FREQUENCY MAGNETIC FIELD GENERATING DEVICE

CROSS-REFERENCE TO RELATED APPLICATIONS

This application relates to and claims priority rights from (1) Japanese Patent Application No. 2017-174895, filed on Sep. 12, 2017 and (2) Japanese Patent Application No. 2018-038182, filed on Mar. 5, 2018, the entire disclosures of which are hereby incorporated by reference herein.

BACKGROUND

Technical Field

The present invention relates to a high-frequency magnetic field generating device.

Background Art

In Optically Detected Magnetic Resonance (ODMR.), a medium that has sublevels and an optical transition level as energy level is simultaneously irradiated with a high-frequency magnetic field (microwave) and light, and thereby a population change or the like due to magnetic resonance between the sublevels is detected as an optical signal with high sensitivity.

In general, after an electron in a ground state is excited with green light, the electron emits red light when returning the ground state. Contrarily, for example, when an electron is irradiated with a high-frequency magnetic field of about 2.87 GHz in a nitrogen and a lattice defect in a diamond structure (NVC: Nitrogen Vacancy Center), the electron moves from the lowest level (ms=0) among three sublevels of the ground state to an energy level (ms=+1 or −1) higher than the lowest level among the three sublevels. When the electron in such state is irradiated with green light, an emitting light intensity is decreased because of no radiation transition to the lowest level (ms=0) among the three levels of the ground level; and therefore, it can be determined by detecting this light whether magnetic resonance occurs due to the high-frequency magnetic field. As mentioned, in ODMR, optically detected magnetic resonance material such as NVC is used.

In a measurement system, a split-ring resonator or an antenna of a coil or wire type is arranged under a diamond sample, and the resonator or the like irradiates the sample with a high-frequency magnetic field in a microwave range of about 2.87 GHz, and while the high-frequency magnetic field and the exciting light are swept, a detection device detects a position at which the red light from an electron decreases and thereby information on a cell near the aforementioned diamond structure is acquired (for example, see NON-PATENT LITERATURE #1).

Further, a magnetic measurement device performs magnetic measurement based on ODMR using electron spin resonance (for example, see PATENT LITERATURE #1). In this magnetic measurement device, as well, a magnetic field as micro wave is generated with only one coil.

CITATION LIST

Patent Literature

PATENT LITERATURE #1: Japanese patent application publication 2012-110489.

Non-patent Literature

NON-PATENT LITERATURE #1: Kento Sasaki, et. al., "Broadband, large-area microwave antenna for optically-detected magnetic resonance of nitrogen-vacancy centers in diamond", REVIEW OF SCIENTIFIC INSTRUMENTS 87, 053904 (2016).

SUMMARY

Technical Problem

However, the aforementioned coil or antenna is capable of generating a three-dimensional uniform high-frequency magnetic field only in a very narrow range, and therefore high detection sensitivity of ODMR is hardly achieved. For example, in case of NON-PATENT LITERATURE #1, as shown in FIG. 20, a ring-antenna resonator is used that is a circular copper plate with a radius R (about 7 mm), and a slit is formed at the center of the plate and further a penetrating hole with a radius r (about 0.5 mm) is formed at a tip of the slit. A high-frequency power supply provides current with about 2.87 GHz to the resonator, and thereby, as shown in FIG. 21, although a uniform magnetic field is generated at an area within a 1-mm radius from the center, the magnetic field intensity gradually decreases along a radius direction from the center of the coil in the other area, i.e. that is 98 percent of the area of the copper plate; and therefore, this area can not be used for the detection based on ODMR. It should be noted that the same problem arises in another measurement using electron spin resonance such as Electrically Detected Magnetic Resonance (EDMR).

The present invention is conceived in view of the aforementioned problem, and provides a high-frequency magnetic field generating device that generates a substantially uniform high-frequency magnetic field in a wide three dimensional range and improves detection sensitivity in measurement based on electron spin resonance.

Solution to Problem

A high-frequency magnetic field generating device according to the present invention includes two coils arranged with a predetermined gap in parallel with each other, the two coils (a) in between which electron spin resonance material is arranged or (b) arranged at one side from electron spin resonance material; a high-frequency power supply that generates microwave current that flows in the two coils; and a transmission line part connected to the two coils, that sets a current distribution so as to locate the two coils at positions other than a node of a stationary wave.

A high-frequency magnetic field generating device according to the present invention includes a high-frequency power supply; at least two pairs of coils; and at least two transmission lines that include (a) a transmission line in between (a1) one coil in one pair among the two pairs and (a2) one coil in the other pair among the two pairs and (b) a transmission line in between (b1) the other coil in the one pair among the two pairs and (b2) the other coil in the other pair among the two pairs. The high-frequency power supply generates microwave current that flows in two coils that form each pair among the at least two pairs. Further, the two coils that form each pair among the at least two pairs are arranged with a predetermined gap in parallel with each other, the two coils (a) in between which electron spin resonance material is arranged or (b) arranged at one side from electron spin resonance material. Furthermore, the at least two transmission lines set a current distribution so as to locate the coils in the at least two pairs at positions other than a node of a stationary wave.

A high-frequency magnetic field generating device according to the present invention includes a circuit board; a penetrating hole in the circuit board; a plate coil arranged in the penetrating hole; a high-frequency power supply that generates microwave current that flows in the plate coil; and a transmission line part connected to the plate coil, that sets a current distribution so as to locate the plate coil at a position other than a node of a stationary wave. Further, a longitudinal direction of a cross section of the plate coil is perpendicular to the circuit board, Furthermore, (a) one edge line part in a top end side and (b) one edge line part in a bottom end side among four edge line parts of the plate coil act as two coils arranged with a predetermined gap in parallel with each other, the two coils (a) in between which electron spin resonance material is arranged or (b) arranged at one side from electron spin resonance material.

Advantageous Effects of Invention

The present invention provides a high-frequency magnetic field generating device that generates a substantially uniform high-frequency magnetic field in a wide three dimensional range and improves detection sensitivity in measurement based on electron spin resonance.

These and other objects, features and advantages of the present disclosure will become more apparent upon reading of the following detailed description along with the accompanied drawings.

DETAILED DESCRIPTION

Hereinafter, embodiments according to aspects of the present invention will be explained with reference to drawings.

Embodiment 1

Figure 1:
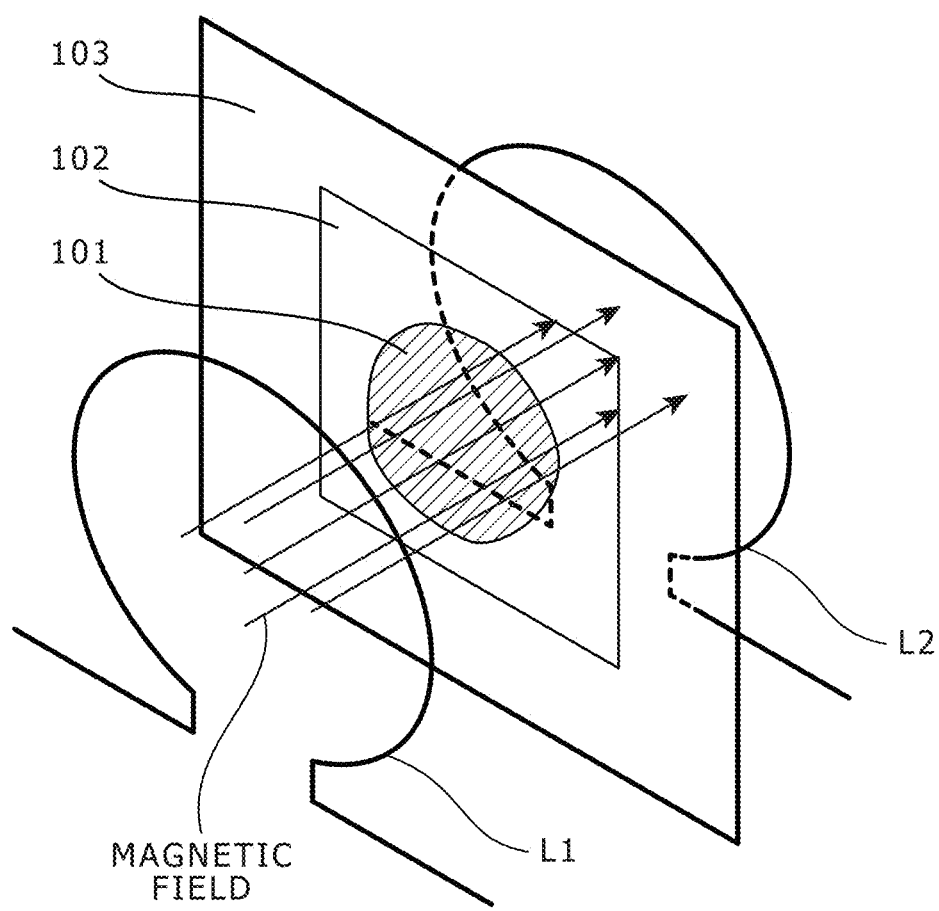
FIG. 1 shows a perspective view diagram that explains an arrangement of coils in a high-frequency magnetic field generating device in an embodiment of the present invention.

FIG. 1 shows a perspective view diagram that explains an arrangement of coils in a high-frequency magnetic field generating device in an embodiment of the present invention.

The high-frequency magnetic field generating device in an embodiment of the present invention includes at least two coils L1 and L2. As shown in FIG. 1, the two coils L1 and L2 are arranged with a predetermined gap (e.g. substantially equal to a diameter of the coils L1 and L2) in parallel with each other. Further, a sample 101 is arranged on a plate member 102 such as diamond that includes an NVC as Optically Detected Magnetic Resonance material (hereinafter, called ODMR material), and the plate member 102 is fixed on a sample plate 103. Furthermore, the two coils L1 and L2 are arranged such that the plate member 102 including an NVC as the ODMR material is arranged in between the two coils L1 and L2. The ODMR material is a sort of electron spin resonance material.

The two coils L1 and L2 have identical shapes to each other, and are arranged so as to have identical central axes to each other. Here, the number of turns of each coil L1 or L2 is set as substantially one turn (less than one turn). In the two coils L1 and L2, microwave current flows, and the two coils L1 and L2. generate alternate magnetic fields as microwaves in phase with each other (i.e. toward identical directions to each other at each time point), respectively. The alternate magnetic fields are applied to the ODMR material, and in addition to the alternate magnetic fields generated by the coils L1 and L2, a static magnetic field (not shown) is applied to the ODMR material. Further, using an optical system (not shown), the ODMR material is irradiated with a measurement light such as laser light beam of a predetermined wavelength, and a measurement based on Optically Detected Magnetic Resonance (e.g. magnetic measurement, orientation measurement of an NVC, temperature measurement of an NVC or the like) is performed, for example, by observing radiant light having a specific wavelength.

Figure 2:
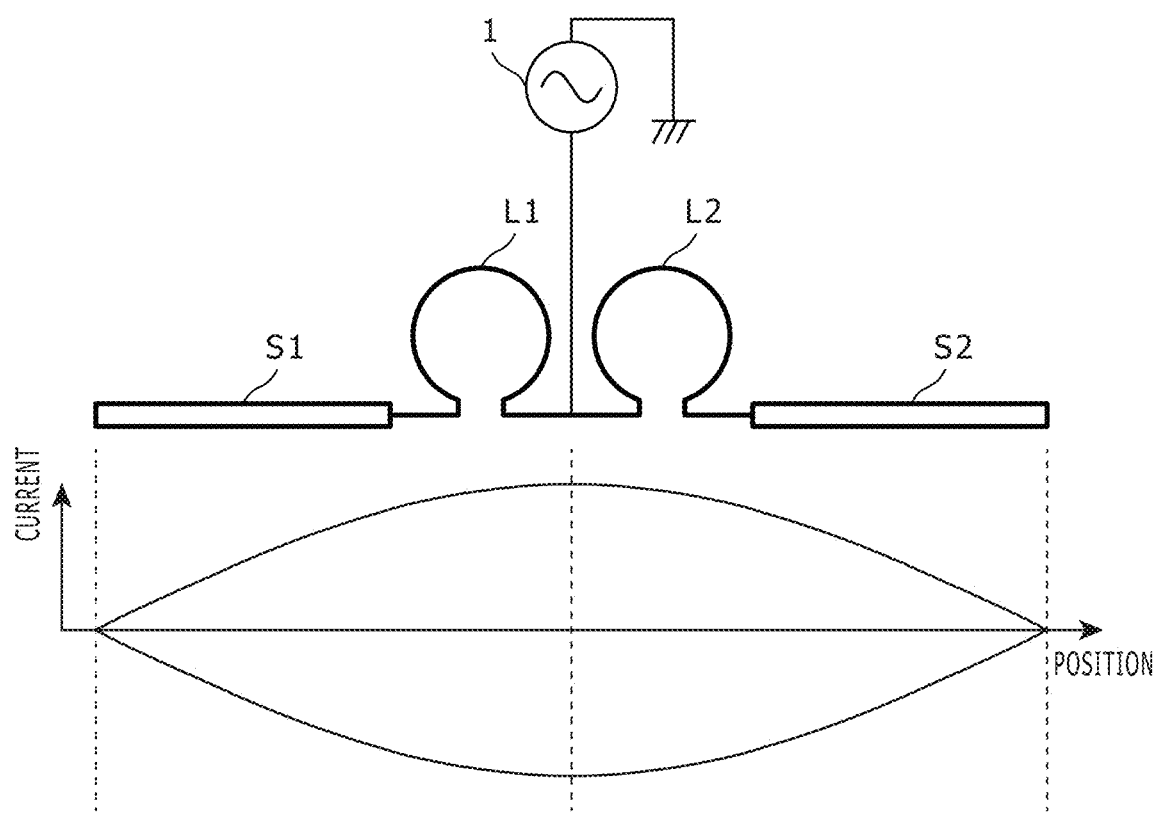
FIG. 2 shows a circuit diagram that indicates a configuration of a high-frequency magnetic field generating device in Embodiment 1 of the present invention.

FIG. 2 shows a circuit diagram that indicates a configuration of a high-frequency magnetic field generating device in Embodiment 1 of the present invention.

As shown in FIG. 2, the high-frequency magnetic field generating device in Embodiment 1 further includes a high-frequency power supply 1, and two line units S1 and S2.

The high-frequency power supply 1 generates microwave current that flows in the two coils L1 and L2. Specifically, the high-frequency power supply 1 generates the microwave current in a frequency band required for the Optically Detected Magnetic Resonance (here, about 2.87 GHz).

The two line units S1 and S2 form a transmission line part respectively connected to the two coils L1 and L2, and set a current distribution so as to locate the two coils L1 and L2 at positions other than a node of a stationary wave.

Each of the line units S1 and S2 may be formed as one conductive wire line or as a distributed constant circuit including a resister element, a condenser element and/or the like.

Specifically, in Embodiment 1, as shown in FIG. 2, one-side ends of the two line units S1 and S2 are open-circuited, and other-side ends of the two line units S1 and S2 are connected to one-side ends of the two coils L1 and L2, respectively. Further, other-side ends of the two coils L1 and L2 are electrically connected to each other, and the high-frequency power supply 1 is connected to a connecting point between the other-side ends of the two coils L1 and L2. Therefore, microwave current flows from the high-frequency power supply 1 into the other-side ends of the two coils L1 and L2. The two coils L1 and L2 have identical shapes to each other, and the line units S1 and S2 also have identical shapes to each other. Consequently, in view from the high-frequency power supply 1, (a) the coil L1 and the line unit S1 and (b) the coil L2 and the line unit S2 have identical high frequency characteristics (i.e. identical electrical lengths) to each other.

For example, if both (a) an electrical length of the coil L1 and the line unit S1 and (b) an electrical length of the coil L2 and the line unit S2 are LAMBDA/4 (LAMBDA: wavelength of the microwave), then a current distribution as shown in FIG. 2 appears, and the coils L1 and L2 are not located at any nodes of a stationary wave but located near antinodes of a stationary wave; and consequently, sufficient microwave current flows in the coils L1 and L2 and induces a magnetic field as a microwave.

For example, if the high-frequency power supply 1 generates a microwave of 2.87 GHz, then the wavelength is about 10 cm, and therefore, the electrical length of the coil L1 and the line uniut S1 and the electrical length of the coil L2 and the line unit S2 are set as about 2.5 cm. In addition, for easy tuning, it is favorable that lengths of the coils L1 and L2 are set to be shorter than a half of lengths of the line units S1 and S2.

The following part explains a behavior of the high-frequency magnetic field generating device in Embodiment 1.

When the high-frequency power supply 1 generates a microwave as alternate power, microwave current flows into (a) the coil L1 and the line uniut S1 and (b) the coil L2 and the line unit S2. Here, since the impedance is matched for the whole circuit, there is no need to use an impedance matching unit separately at a terminal end of (a) the coil L1 and the line uniut S1 and at a terminal end of (b) the coil L2 and the line unit S2, and a stationary wave as shown in FIG. 2 is formed in (a) the coil L1 and the line uniut S1 and (b) the coil L2 and the line unit S2.

Consequently, in the coils L1 and L2, alternate current flows with identical amplitude to each other in phase with each other. A magnetic field as microwave is formed by the current that flows in the coils L1 and L2. Further, the coils L1 and L2 are arranged coaxially and substantially in parallel with each other, and therefore, in a space between the coil L1 and the coil L2, a direction of the magnetic field is substantially in parallel with a central axis of the coils L1 and L2 and the magnetic field is substantially uniform.

As mentioned, in Embodiment 1, the two coils L1 and L2 are arranged with a predetermined gap in parallel with each other and in between the two coils L1 and L2 electron spin resonance material is arranged. The high-frequency power supply 1 generates microwave current that flows in the two coils L1 and L2. The two line units S1 and S2 are connected to the two coils L1 and L2, respectively, and set a current distribution so as to locate the two coils L1 and L2 at positions other than a node of a stationary wave.

Consequently, a substantially uniform high-frequency magnetic field is generated in a wide three dimensional range in between the coils L1 and L2. Consequently, detection sensitivity of ODMR can be improved.

In this embodiment, the one-side ends of the line units S1 and S2 are open-circuited. Alternatively, for example, high impedance circuits having a high impedance sufficiently for a frequency of the microwave current (i.e. oscillation frequency of the power supply) may be connected to these open-circuited one-side ends and a ground.

Further, as shown in FIG. 1, the two coils L1 and L2 are arranged with a predetermined gap in parallel with each other such that ODMR meterial is arranged in between the two coils L1 and L2. Alternatively, both of the two coils L1 and L2 may be arranged at one side from the electron spin resonance material. In such a case, although resonance band width gets a little narrow, arrangement position of the ODMR material gets high flexibility.

Furthermore, in FIG. 1, the plate member 102 and the sample plate 103 are arranged to be perpendicular to the direction of the magnetic field (i.e, the direction of the central axis of the coils L1 and L2). Alternatively, the plate member 102 and the sample plate 103 may be arranged to be slanted to the direction of the magnetic field (i.e. the direction of the central axis of the coils L1 and L2). Even in such a case, the uniform magnetic field is applied to the plate member 102.

Embodiment 2

Figure 3:
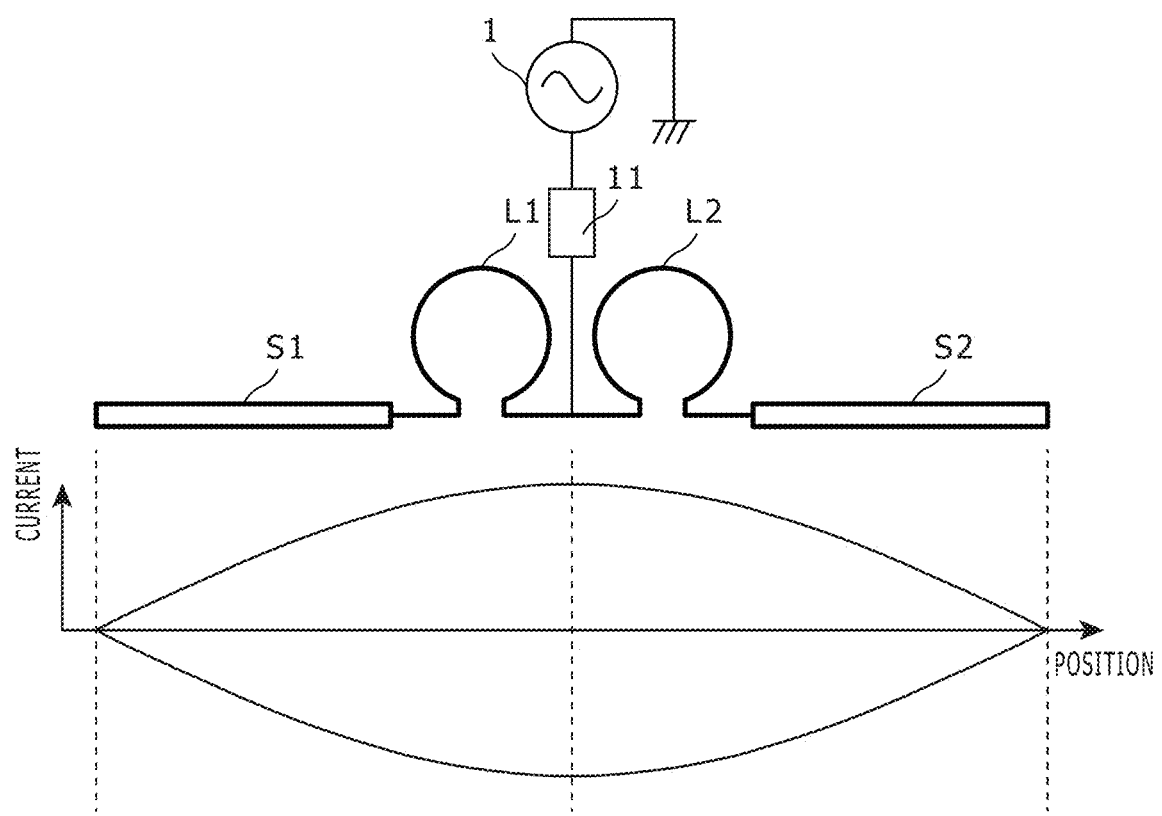
FIG. 3 shows a circuit diagram that indicates a configuration of a high-frequency magnetic field generating device in Embodiment 2 of the present invention.

FIG. 3 shows a circuit diagram that indicates a configuration of a high-frequency magnetic field generating device in Embodiment 2 of the present invention. The high-frequency magnetic field generating device in Embodiment 2 has the same configuration as the configuration of the high-frequency magnetic field generating device in Embodiment 1, and additionally includes an impedance matching unit 11 in between the high-frequency power supply 1 and the two coils L1 and L2.

If impedance matching is not achieved in between the high-frequency power supply 1 and the two coils L1 and L2, then a microwave from the high-frequency power supply 1 reflects at the coils L1 and L2, and consequently adequate microwave current does not flow into the coils L1 and L2. Therefore, if impedance matching is not achieved in between the high-frequency power supply 1 and the two coils L1 and L2, then the impedance matching unit 11 is installed. Consequently, the impedance matching is achieved and the microwave from the high-frequency power supply 1 propagates into the coils L1 and L2. As the impedance matching unit 11, for example, a resistance element (R), a capacitance element (C), an inductance element (L) or a combination thereof is used.

In FIG. 3, the impedance matching unit 11 is installed in between the high-frequency power supply 1 and a connecting point between the coils L1 and L2, Alternatively, two impedance matching units 11 may be installed (a) in between the high-frequency power supply 1 and the coil L1 and (b) in between the high-frequency power supply 1 and the coil L2, respectively.

Further, in a high-frequency magnetic field generating device in another embodiment mentioned below, the same impedance matching unit(s) may be installed as well. If the high-frequency power supply 1 is connected to two line units in another embodiment, the impedance matching unit (s) may be installed in between the high-frequency power supply 1 and the two line units in the same manner.

As mentioned, in Embodiment 2, even when the impedance matching is not achieved with only the coils L1 and L2 and the line units S1 and S2, the impedance matching can be achieved by the impedance matching unit 11.

Embodiment 3

Figure 4:
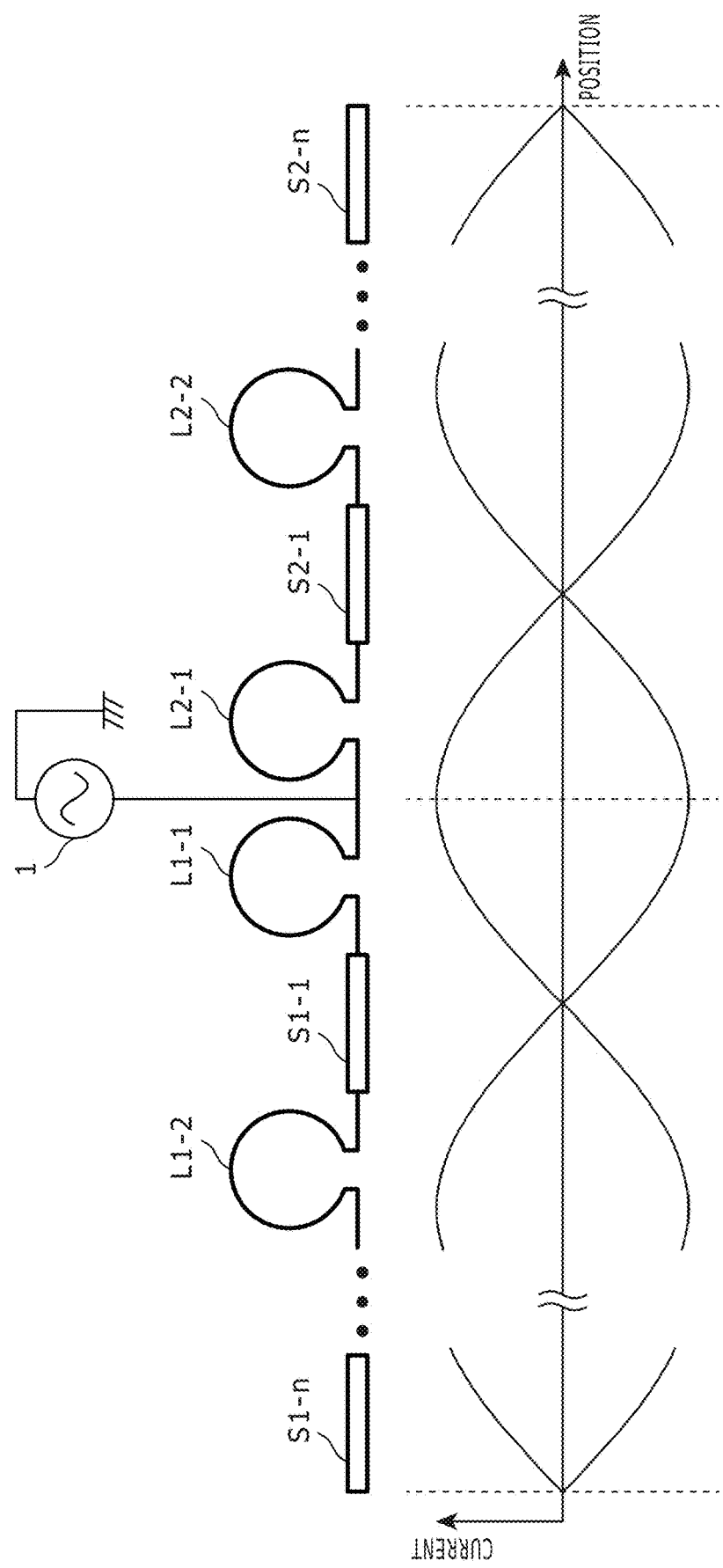
FIG. 4 shows a circuit diagram that indicates a configuration of a high-frequency magnetic field generating device in Embodiment 3 of the present invention.

FIG. 4 shows a circuit diagram that indicates a configuration of a high-frequency magnetic field generating device in Embodiment 3 of the present invention. The high-frequency magnetic field generating device in Embodiment 3 includes at least two pairs of coils (L1-$i$, L2-$i$) ($i$=1, . . . , n; n>1) and at least two line units S1-$j$, S2-$j$ that include (a) a line unit S1-$j$ in between (a1) one coil L1-$i$ in one pair among the at least two pairs and (a2) one coil L1-$i$ in the other pair among the at least two pairs and (b) a line unit S2-$j$ in between (b1) the other coil L2-$i$ in the one pair among the at least two pairs and (b2) the other coil L2-$i$ in the other pair among the at least two pairs.

In Embodiment 3, the high-frequency power supply 1 generates microwave current that flows two coils L1-$i$ and L2-$i$ that form each pair among the aforementioned at least two pairs of coils (L1-$i$, L2-$i$).

The two coils that form each pair among the aforementioned at least two pairs of coils (L1-$i$, L2-$i$) are arranged with a predetermined gap in parallel with each other, and electron spin resonance material is arranged in between these two coils. For example, the coils L1-1 to L1-$n$ are arranged such that the magnetic fields induced by the coils L1-1 to L1-$n$ gets in phase with each other, and the coils L2-1 to L2-$n$ are arranged such that the magnetic fields induced by the coils L2-1 to L2-$n$ gets in phase with each other. Thus, the magnetic fields induced by the coils L1-1 to L1-$n$ and L2-1 to L2-$n$ have identical directions to each other.

Further, the aforementioned at least two line units S1-$j$ and S2-$j$ as a transmission line unit set a current distribution so as to locate the coils L1-$i$ and L2-$i$ in the at least two pairs at positions other than a node of a stationary wave. For example, all of the line units S1-$j$ and S2-$j$ have identical electric lengths with each other, the line units S1-$j$ and the coils L1-$j$ are alternately arranged, and the line units S2-$j$ and the coils L2-$i$ are alternately arranged. Specifically, the line unit S1-$j$ is arranged in between the coil L1-$j$ and the coil L1-($j$+1), the line unit S2-$j$ is arranged in between the coil L2-$j$ and the coil L2-($j$+1), and a terminal end of the line unit S1-$n$ and a terminal end of the line unit S2-$n$ are open-circuited.

For example, the coils and L2-$i$ have identical shapes to each other and are arranged so as to have identical central axes to each other. Here, the number of turns of each coil L1-$i$ or L2-$i$ is set as substantially one turn (less than one turn); and if both (a) an electrical length of the coils L1-1 to L1-$n$ and the line unit(s) S1-$j$ therebetween and (b) an electrical length of the coil L2-1 to L2-$n$ and the line unit(s) S2-$j$ therebetween are (2n−1)*LAMBDA/4, then a current distribution as shown in FIG. 4 appears, and all of the coils L1-$i$ and L2-$i$ are located at positions other than any nodes of a stationary wave; and consequently, sufficient microwave current flows in the coils L1-$i$ and L2-$i$ and induces a magnetic field as a microwave.

As mentioned, in Embodiment 3, a large number of the coils and L1-$i$ and L2-$i$ are installed. Consequently, the induced high-frequency magnetic field gets a high intensity.

Embodiment 4

Figure 5:
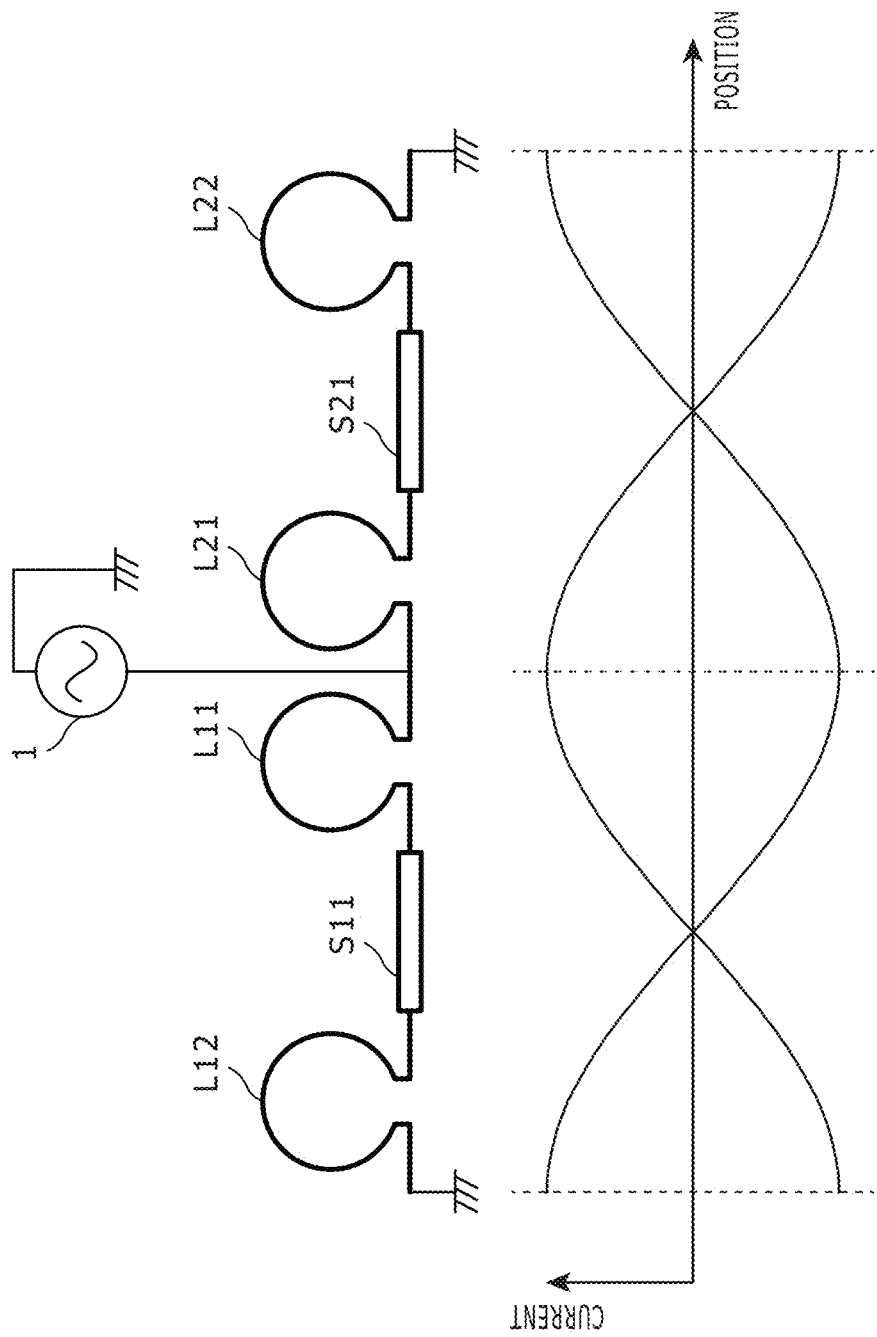
FIG. 5 shows a circuit diagram that indicates a configuration of a high-frequency magnetic field generating device in Embodiment 4 of the present invention.

FIG. 5 shows a circuit diagram that indicates a configuration of a high-frequency magnetic field generating device in Embodiment 4 of the present invention. As shown in FIG. 5, the high-frequency magnetic field generating device in Embodiment 4 includes two pairs of coils (L11, L21) and (L12, L22), and two line units S11 and S21 as a transmission line part.

Figure 6:
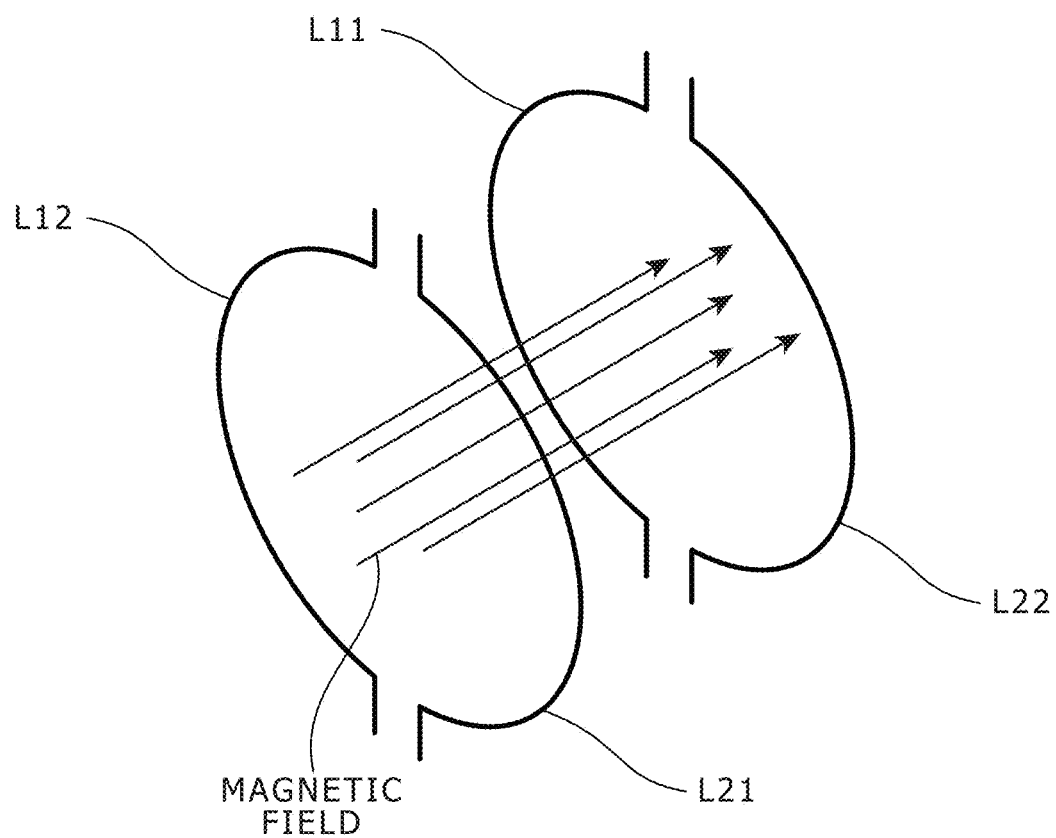
FIG. 6 shows a perspective view diagram that explains an example of an arrangement of coils in a high-frequency magnetic field generating device in Embodiment 4 of the present invention.

FIG. 6 shows a perspective view diagram that explains an example of an arrangement of the coils L11, L12, L21 and L22 in a high-frequency magnetic field generating device in Embodiment 4 of the present invention. As shown in FIG. 6, the number of turns of each coils L11, L21, L12 or L22 is substantially a half of one turn; and the coil L11 and the coil L22 form a pair and induce magnetic fields as microwave in phase with each other, and the coil L12 and the coil L21 form a pair and induce magnetic fields as microwave in phase with each other.

Alternatively, the number of turns of each coils L11, L21, L12 or L22 may be substantially one turn as well as in Embodiment 1, 2 or 3; and the in-phase coils L11 and L22 may be arranged contiguously to each other (i.e. so as to cause the number of turns to get substantially two turns in total), and the in-phase coils L12 and L21 may be arranged contiguously to each other.

Further, in Embodiment 4, (a) one-side ends of the two coils L12 and L22 are connected to a ground, (b) other-side ends of the two coils L12 and L22 are connected to one-side ends of the two line units S11 and S21, (c) other-side ends of the two line units S11 and S21 are connected to one-side ends of the two coils L11 and L21, (d) other-side ends of the two coils L11 and L21 are connected to each other, and (e) the high-frequency power supply 1 is connected to a connecting position between the two coils L11 and L21. Microwave current flows from the high-frequency power supply 1 through the coils L11 and L21 into the other-side ends of the two line units S11 and S21. Therefore, antinodes of the current distribution are located at ends (i.e. short-circuited ends) of the coils L12 and L22, and as shown in FIG. 5, each of the coils L11, L12, L21. and L22 is located at a position other than a node of the current distribution.

Embodiment 5

Figure 7:
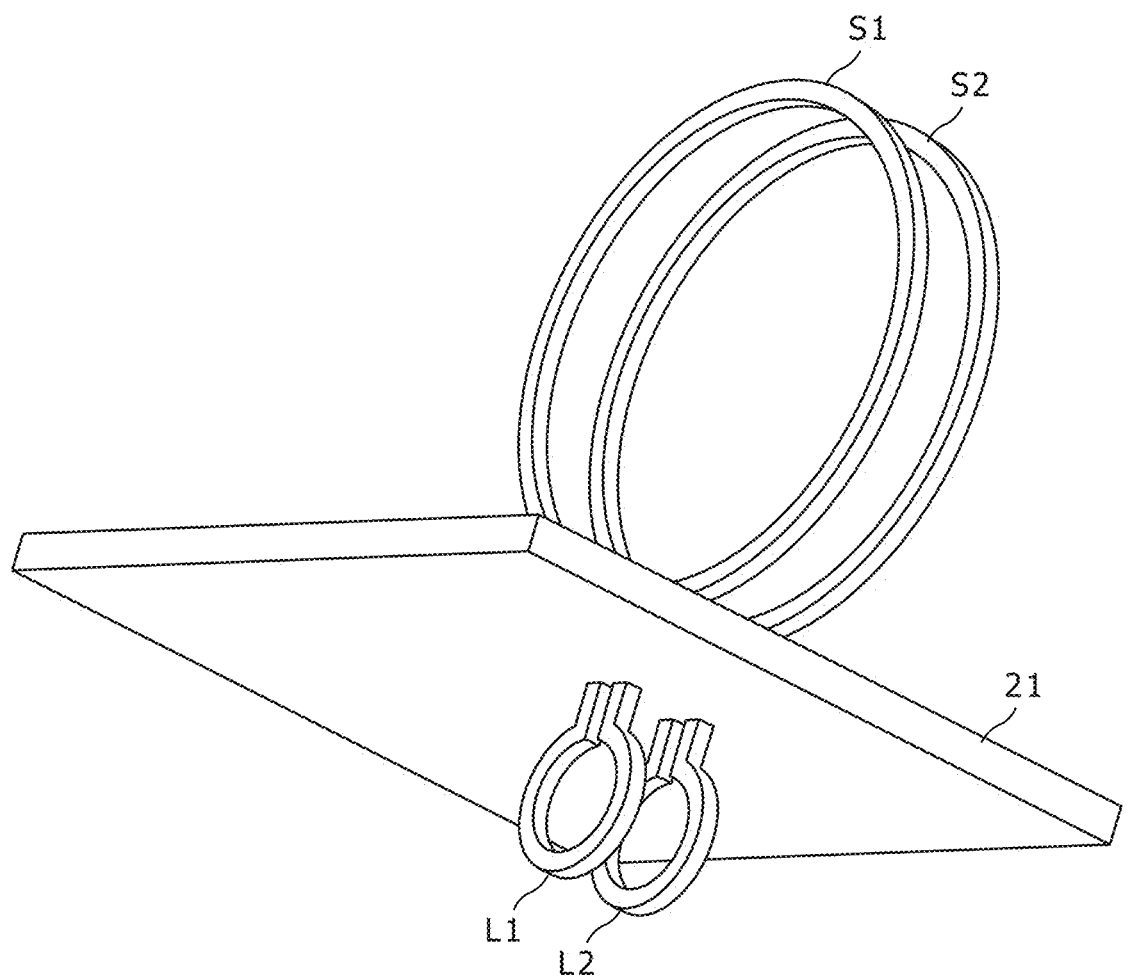
FIG. 7 shows a perspective view diagram that explains an example of an arrangement of coils and line units in a high-frequency magnetic field generating device in Embodiment 5 of the present invention.

FIG. 7 shows a perspective view diagram that explains an example of an arrangement of coils and line units in a high-frequency magnetic field generating device in Embodiment 5 of the present invention.

The high-frequency magnetic field generating device in Embodiment 5 has a circuit configuration as described in Embodiment 1 or 2 (i.e. FIG. 2 or 3), and includes a circuit board 21. The two coils L1 and L2 are arranged on one surface of the circuit board 21 so as to be substantially perpendicular to this surface. Further, in Embodiment 5, the two line units S1 and S2 are line members that have partially-cutted-off ring shapes and are arranged on the other surface of the circuit board 21 so as to be substantially perpendicular to this surface.

Furthermore, in the manner shown in FIG. 2 or 3, the coils L1 and L2, the line units S1 and S2, and the high-frequency power supply 1 are electrically connected, and these electrical connections are established with a wiring pattern on the circuit board 21, a through hole in the circuit board 21, and/or the like.

Behaviors of the high-frequency magnetic field generating device in Embodiment 5 are identical or similar to those in Embodiment 1 or 2, and therefore not explained here.

Embodiment 6

Figure 8:
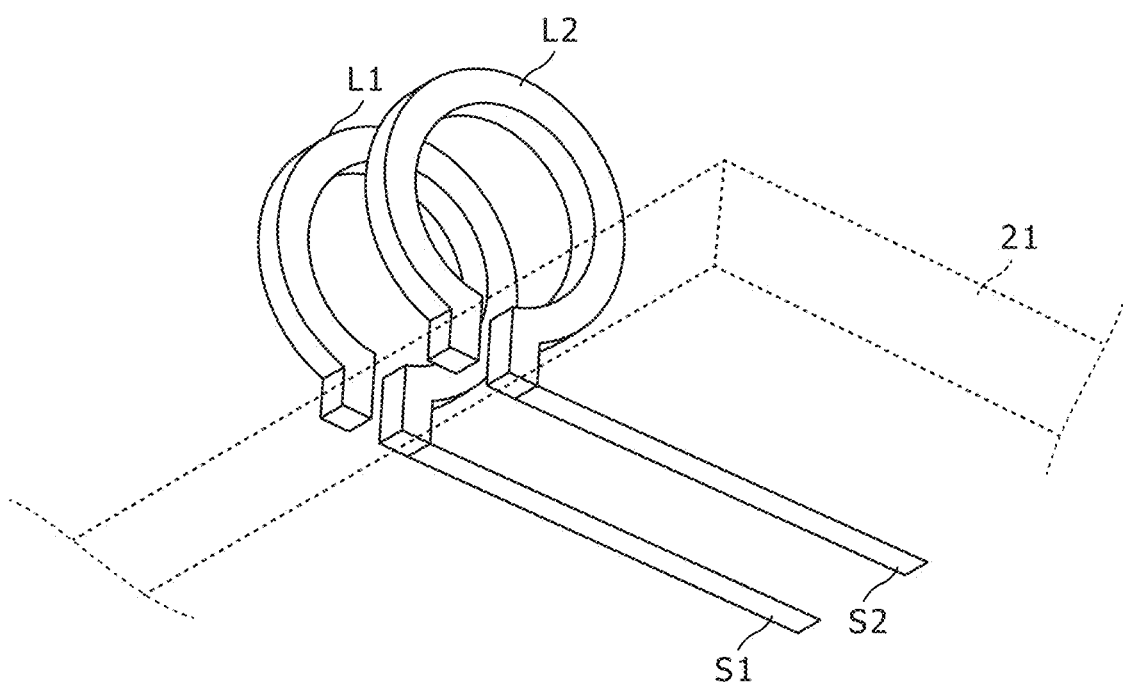
FIG. 8 shows a perspective view diagram that explains an example of an arrangement of coils and line units in a high-frequency magnetic field generating device in Embodiment 6 of the present invention.

FIG. 8 shows a perspective view diagram that explains an example of an arrangement of coils and line units in a high-frequency magnetic field generating device in Embodiment 6 of the present invention.

The high-frequency magnetic field generating device in Embodiment 6 has a circuit configuration as described in Embodiment 1 or 2 (i.e. FIG. 2 or 3), and includes a circuit board 21. The two coils L1 and L2 are arranged on one surface of the circuit board 21 so as to be substantially perpendicular to this surface. Further, in Embodiment 6, the two line units S1 and S2 are wiring patterns, respectively, and are formed on any surface of the circuit board 21.

Figure 9:
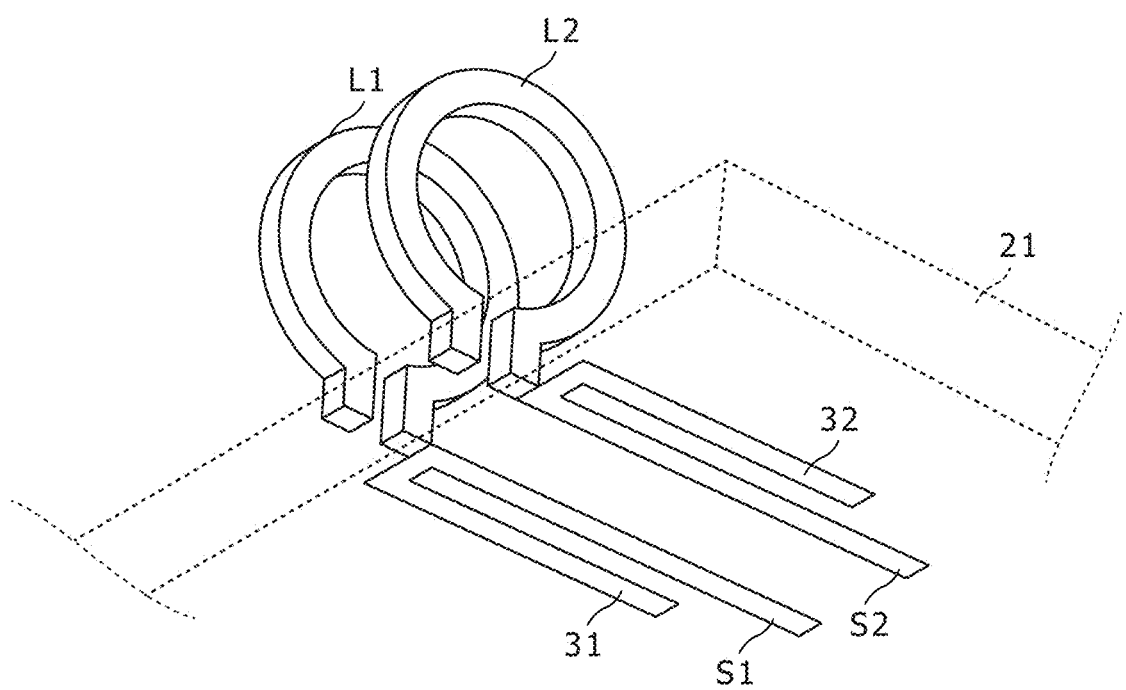
FIG. 9 shows a perspective view diagram that explains another example of line units in a high-frequency magnetic field generating device in Embodiment 6 of the present invention.

FIG. 9 shows a perspective view diagram that explains another example of line units in a high-frequency magnetic field generating device in Embodiment 6 of the present invention. As shown in FIG. 9, branch parts 31 and 32 identical to each other are formed in the line units S1 and S2, respectively. Consequently, using the branch parts 31 and 32, the current distribution can be adjusted in the coils L1 and L2 and the line units S1 and S2, and in addition, a width of input frequency band can be adjusted.

Behaviors of the high-frequency magnetic field generating device in Embodiment 6 are identical or similar to those in Embodiment 1 or 2, and therefore not explained here.

Embodiment 7

Figure 10:
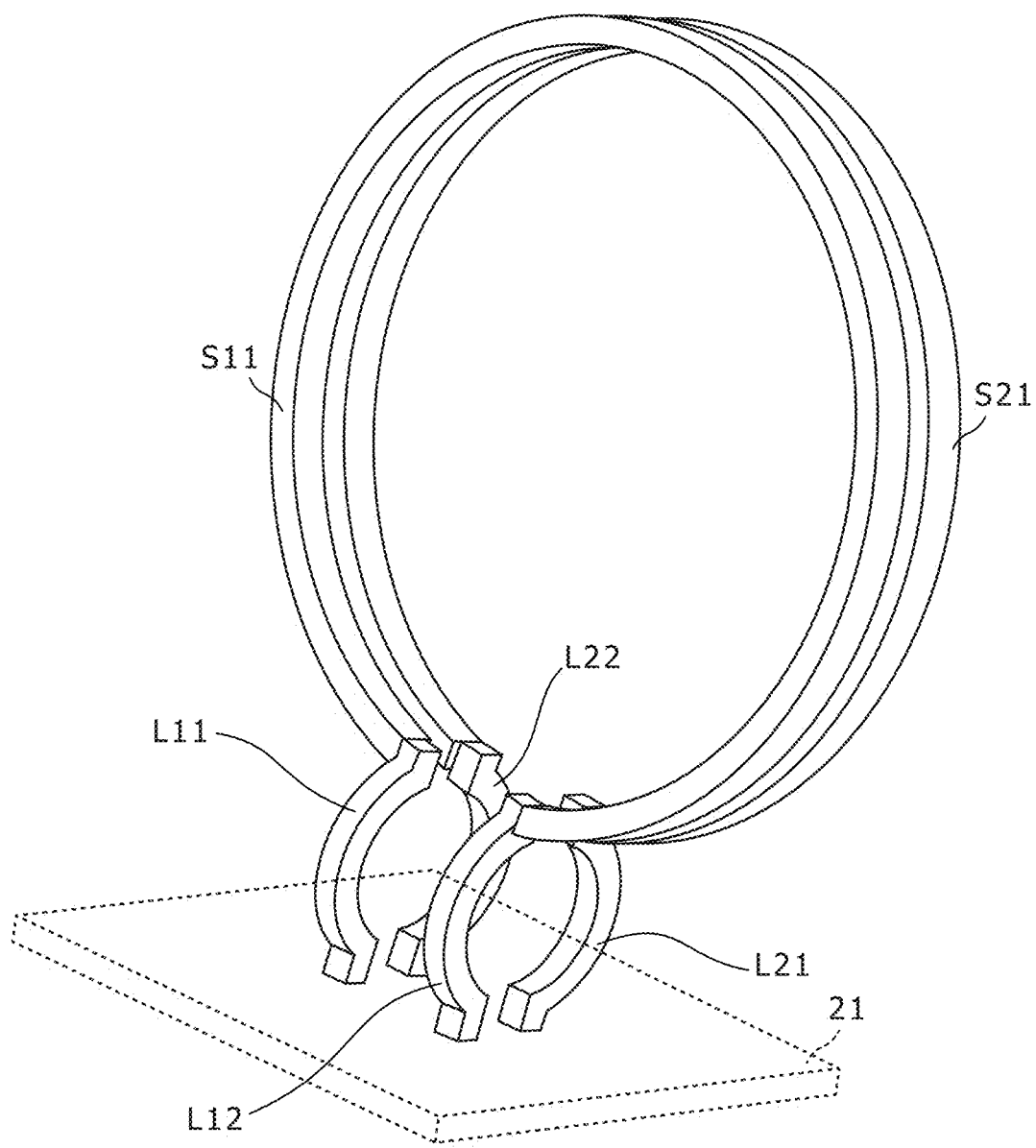
FIG. 10 shows a perspective view diagram that explains an example of an arrangement of coils and line units in a high-frequency magnetic field generating device in Embodiment 7 of the present invention.

FIG. 10 shows a perspective view diagram that explains an example of an arrangement of coils and line units in a high-frequency magnetic field generating device in Embodiment 7 of the present invention.

The high-frequency magnetic field generating device in Embodiment 7 has a circuit configuration as described in Embodiment 4 (i.e. FIG. 5), and includes a circuit board 21. As shown in FIG. 10, in Embodiment 7, the coils L11, L12, L21 and L22 are arranged on the circuit board 21 so as to be perpendicular to the circuit board 21, the line unit S11 that has a partially-cutted-off ring shape is connected to an end of the coil L11 and an end of the coil L12, and the line unit S21 that has a partially-cutted-off ring shape is connected to an end of the coil L21 and an end of the coil L22.

As shown in FIG. 10, the line units S11 and S21 are arranged so as to be perpendicular to an opening direction of the coils L11 and L22 and an opening direction of the coils L12 and L21 (i.e. a direction of a magnetic field formed by the coils L11, L22, L12 and L21), such that magnetic coupling is restrained between (a) the coils L11, L22, L12 and L21 and (b) the line units S11 and S2.

Behaviors of the high-frequency magnetic field generating device in Embodiment 7 are identical or similar to those in Embodiment 4, and therefore not explained here.

Embodiment 8

Figure 11:
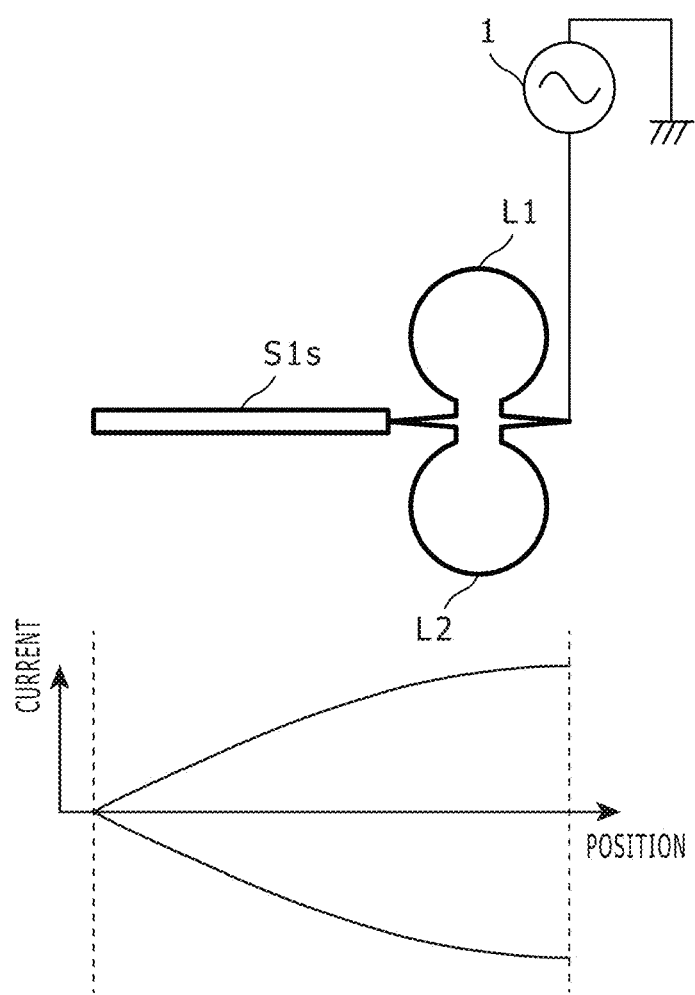
FIG. 11 shows a circuit diagram that indicates a configuration of a high-frequency magnetic field generating device in Embodiment 8 of the present invention.

FIG. 11 shows a circuit diagram that indicates a configuration of a high-frequency magnetic field generating device in Embodiment 8 of the present invention.

In the high-frequency magnetic field generating device in Embodiment 8, as shown in FIG. 11, the two coils L1 and L2 are connected in parallel with each other, and one transmission line Sis as a transmission line part is connected to a connecting point between the two coils L1 and L2. In Embodiment 8, the one transmission line S1s sets a current distribution so as to locate the two coils L1 and L2 at positions other than a node of a stationary wave.

Specifically, in Embodiment 8, as shown in FIG. 11, one end of the line unit S1s is open-circuited, and the other end of the line unit S1s is connected to one connecting point between the two coils L1 and L2. Further, the high-frequency power supply 1 is connected to the other connecting point between the two coils L1 and L2. Therefore, microwave current flows from the high-frequency power supply 1 into the other-side ends of the two coils L1 and L2. The two coils L1 and L2 have identical shapes to each other. Consequently, in view from the high-frequency power supply 1, (a) the coil L1 and the line unit S is and (b) the coil L2 and the line unit S1s have identical high frequency characteristics (i.e. identical electrical lengths) to each other.

For example, if an electrical length of the coils L1 and L2 and the line uniut S1s is LAMBDA/4 (LAMBDA: wavelength of the microwave), then a current distribution as shown in FIG. 11 appears, and the coils L1 and L2 are not located at any nodes of a stationary wave but located near antinodes of a stationary wave; and consequently, sufficient microwave current flows in the coils L1 and L2 and induces a magnetic field as a microwave.

Behaviors of the high-frequency magnetic field generating device in Embodiment 8 are identical or similar to those in Embodiment 1, and therefore not explained here.

Figure 12:
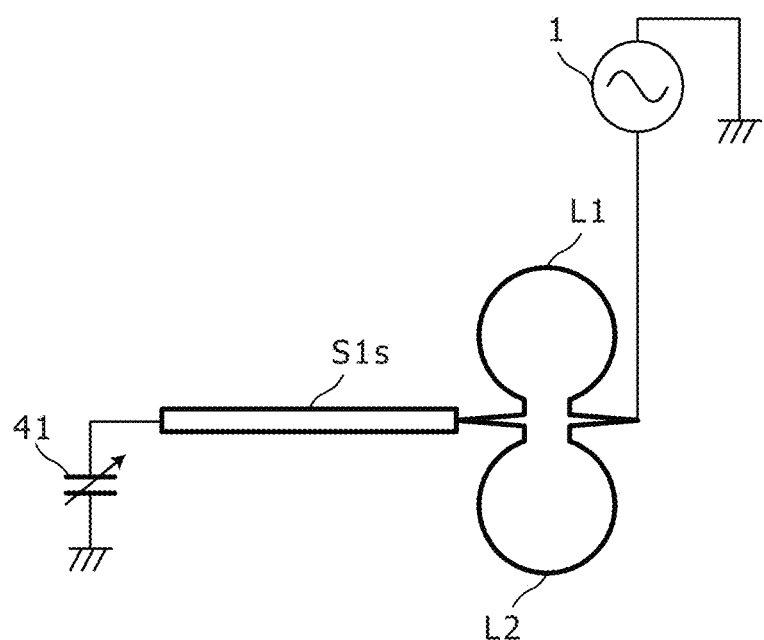
FIG. 12 shows a circuit diagram that indicates a configuration of a high-frequency magnetic field generating device in a modification example #1 of Embodiment 8 of the present invention.
Figure 13:
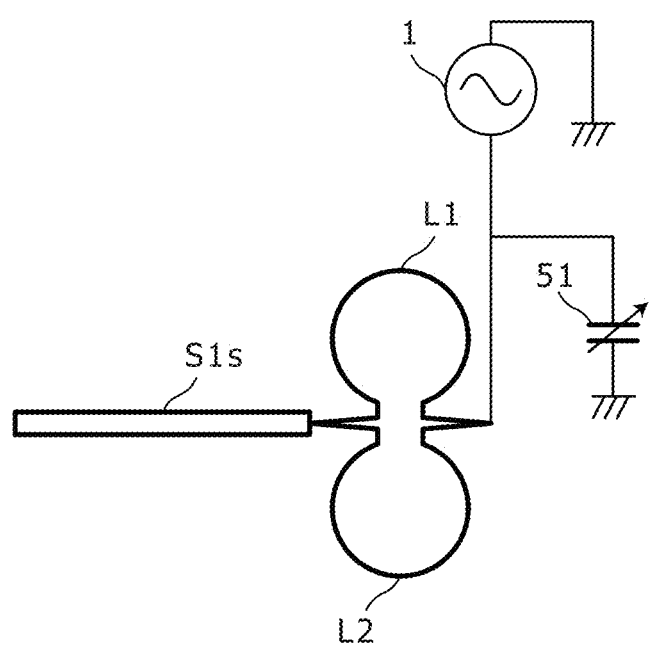
FIG. 13 shows a circuit diagram that indicates a configuration of a high-frequency magnetic field generating device in a modification example #2 of Embodiment 8 of the present invention.

In Embodiment 8, instead of the configuration of the high-frequency magnetic field generating device shown in FIG. 11, modification examples shown in FIG. 12 or 13 may be applied.

FIG. 12 shows a circuit diagram that indicates a configuration of a high-frequency magnetic field generating device in a modification example #1 of Embodiment 8 of the present invention. In the modification example #1 shown in FIG. 12, one end of a variable capacitance element 41 is connected to one end of the line unit S1s such that this one end is not connected to the coils L1 and L2, and the other end of the variable capacitance element 41 is connected to a ground. Consequently, even if displacement appears between the central axes, a center of a resonance frequency band of the coils L1 and L2 can be adjusted by changing a capacitance of the variable capacitance element 41 so as to cause the center of a resonance frequency band to get closest to a desired frequency. A very small capacitance value is sufficient of this variable capacitance element 41. Therefore, the variable capacitance element 41 may be a device that moves a position of a part of the line unit S1s a little. Alternatively, the variable capacitance element 41 may be a variable capacitor that has a small capacitance, for example.

FIG. 13 shows a circuit diagram that indicates a configuration of a high-frequency magnetic field generating device in a modification example #2 of Embodiment 8 of the present invention. In the modification example #2 shown in FIG. 13, one end of a variable capacitance element 51 is connected to one-side ends (i.e. the ends on the power supply side) of the coils L1 and L2 such that the one-side ends are not connected to the line unit S1s, and the other end of the variable capacitance element 51 is connected to a ground. Consequently, as well as the aforementioned modification example #1, even if shapes of the coils L1 and L2 change or displacement occurs between the central axes, a center of a resonance frequency band of the coils L1 and L2 can be adjusted by changing a capacitance of the variable capacitance element 51 so as to cause the center of a resonance frequency band to get closest to a desired frequency. A very small capacitance value is sufficient of this variable capacitance element 51. Therefore, the variable capacitance element 51 may be (a) a variable capacitor that has a small capacitance, for example, (b) a device that moves a part of a conductive line between the power supply and the coils L1 and L2, or the like.

Embodiment 9

Figure 14:
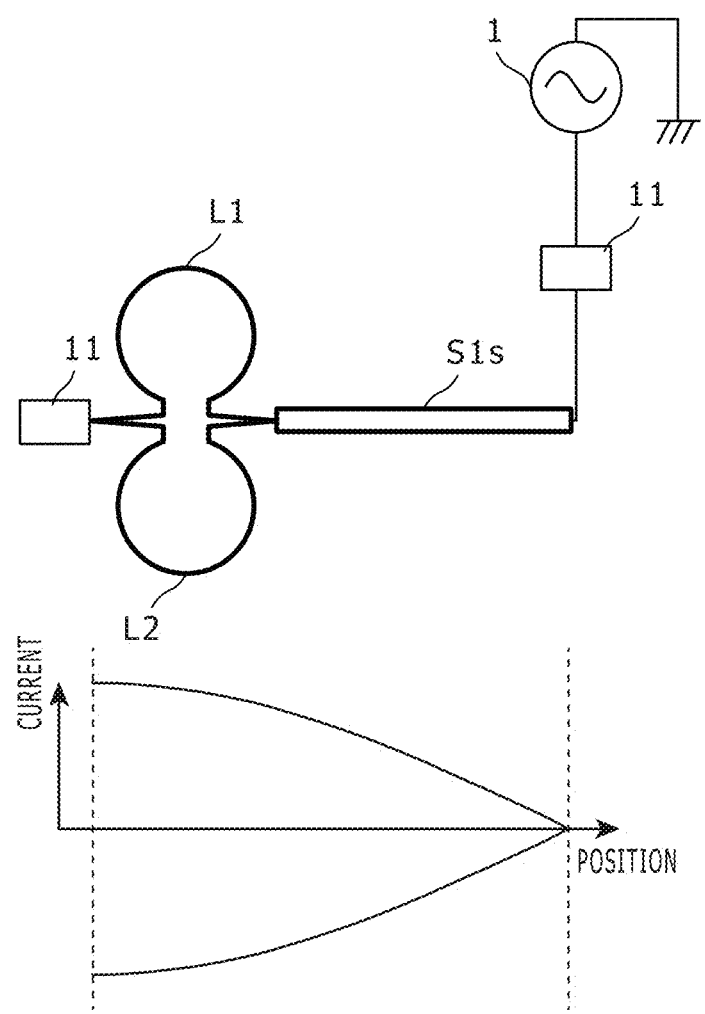
FIG. 14 shows a circuit diagram that indicates a configuration of a high-frequency magnetic field generating device in Embodiment 9 of the present invention.

FIG. 14 shows a circuit diagram that indicates a configuration of a high-frequency magnetic field generating device in Embodiment 9 of the present invention.

In the high-frequency magnetic field generating device in Embodiment 9, as shown in FIG. 14, the two coils L1 and L2 are connected in parallel with each other, and one transmission line S1s as a transmission line part is connected to a connecting point between the two coils L1 and L2. In Embodiment 9, the one transmission line S1s sets a current distribution so as to locate the two coils L1 and L2 at positions other than a node of a stationary wave.

Specifically, in Embodiment 9, as shown in FIG. 14, one end of the line unit S1s is connected through a first impedance matching unit 11 to the high-frequency power supply 1, and the other end of the line uniut S1s is connected to one connecting point between the two coils L1 and L2. Further, one end of a second impedance matching unit 11 is connected to the other connecting point between the two coils L1 and L2. The other end of the second impedance matching unit 11 is open-circuited. Therefore, microwave current flows from the high-frequency power supply 1 through the first impedance matching unit 11 and the line uniut S1s to the ends of the two coils L1 and L2. The two coils L1 and L2 have identical shapes to each other. Consequently, in view from the high-frequency power supply 1, (a) the coil L1 and the line uniut S1s and (b) the coil L2 and the line uniut S1s have identical high frequency characteristics (i.e. identical electrical lengths) to each other.

For example, if an electrical length of the coils L1 and L2 and the line uniut S1s is LAMBDA/4 (LAMBDA: wavelength of the microwave), then a current distribution as shown in FIG. 14 appears, and the coils L1 and L2 are not located at any nodes of a stationary wave but located near antinodes of a stationary wave; and consequently, sufficient microwave current flows in the coils L1 and L2 and induces a magnetic field as a microwave.

Embodiment 10

Figure 15:
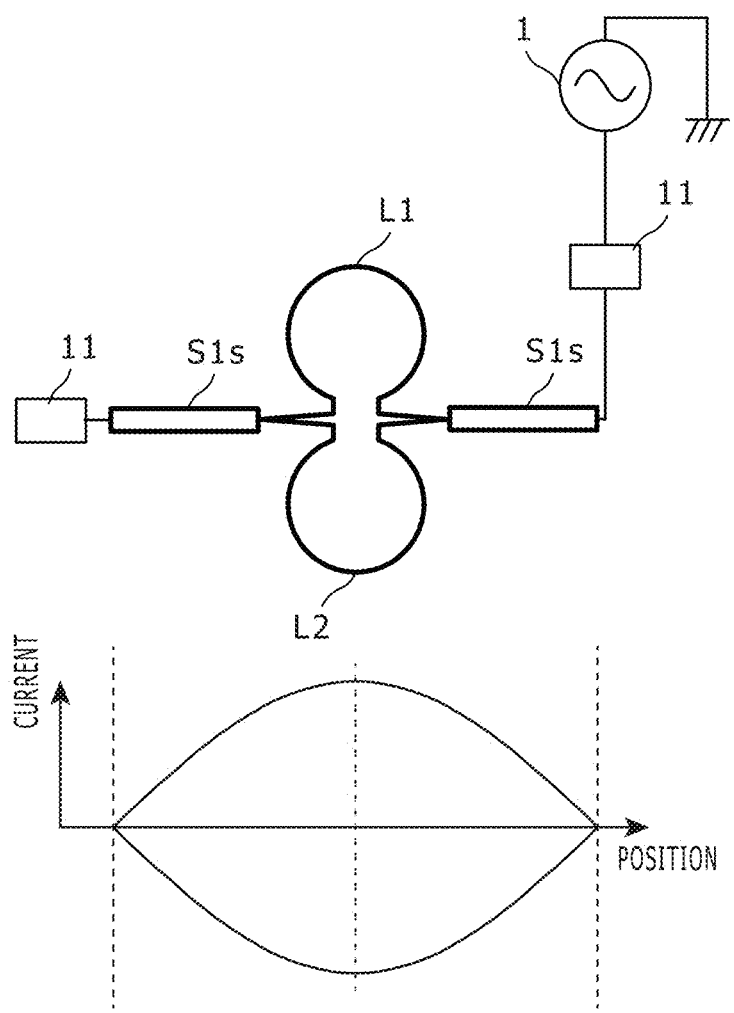
FIG. 15 shows a circuit diagram that indicates a configuration of a high-frequency magnetic field generating device in Embodiment 10 of the present invention.

FIG. 15 shows a circuit diagram that indicates a configuration of a high-frequency magnetic field generating device in Embodiment 10 of the present invention.

In the high-frequency magnetic field generating device in Embodiment 10, as shown in FIG. 15, the two coils L1 and L2 are connected in parallel with each other, and transmission lines S1s as a transmission line part are connected to connecting points between the two coils L1 and L2, respectively. In Embodiment 10, the transmission lines S1s set a current distribution so as to locate the two coils L1 and L2 at positions other than a node of a stationary wave.

Specifically, in Embodiment 10, as shown in FIG. 15, one end of the first line uniut S1s is connected through a first impedance matching unit 11 to the high-frequency power supply 1, and the other end of the first line uniut S1s is connected to one connecting point between the two coils L1 and L2. Further, one end of a second line unit S1s is connected to the other connecting point between the two coils L1 and L2. The other end of the second line uniut S1s is connected to one end of a second impedance matching unit 11. The other end of the second impedance matching unit 11 is open-circuited. Therefore, microwave current flows from the high-frequency power supply 1 through the first impedance matching unit 11 and the first line unit S1s to the ends of the two coils L1 and L2. The two coils L1 and L2 have identical shapes to each other, and the line units S1s also have identical shapes to each other. Consequently, in view from the high-frequency power supply 1, (a) the coil L1 and the line units S1s and (b) the coil L2 and the line units S1s have identical high frequency characteristics (i.e. identical electrical lengths) to each other.

For example, if an electrical length of the coils L1 and L2 and the line units S1s is LAMBDA/2 (LAMBDA: wavelength of the microwave), then a current distribution as shown in FIG. 15 appears, and the coils L1 and L2 are not located at any nodes of a stationary wave but located near a.ntinodes of a stationary wave; and consequently, sufficient microwave current flows in the coils L1 and L2 and induces a magnetic field as a microwave.

Embodiment 11

Figure 16:
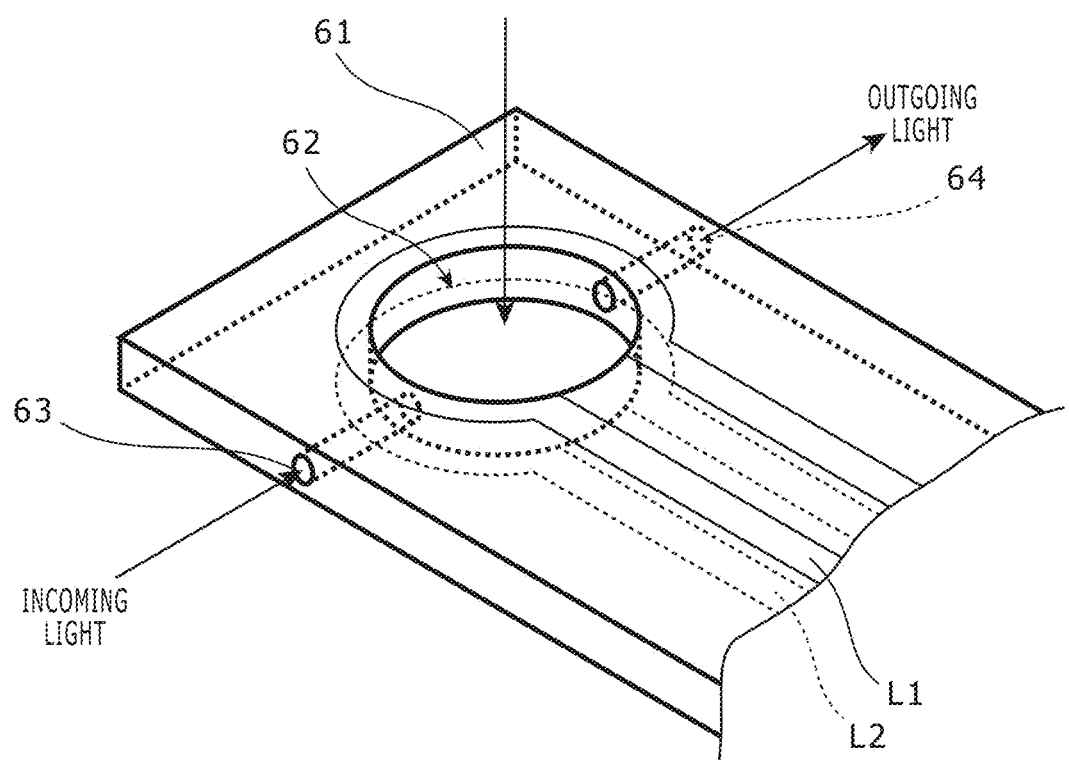
FIG. 16 shows a diagram that indicates a configuration of a high-frequency magnetic field generating device in Embodiment 11 of the present invention.

FIG. 16 shows a diagram that indicates a configuration of a high-frequency magnetic field generating device in Embodiment 11 of the present invention.

In Embodiment 11, the coils L1 and L2 are formed as metal patterns in parallel with each other on a front surface and a back surface of a circuit board 61 that has a predetermined thickness. Further, a penetrating hole 62 is formed so as to penetrate a center of the coils L1 and L2. This penetrating hole 62 enables the high-frequency alternate magnetic field to be applied to a sample not only (a) in a case that a pair of the coil L1 and L2 is arranged at one side from the sample with a predetermined distance but (b) in a case that the sample is arranged at any position between the coils L1 and L2 in the height direction.

Further, as shown in FIG. 16, penetrating holes 63 and 64 may be formed in the wall thickness of the circuit board 61 so as to be parallel to a radius direction of the coils L1 and L2. In such a case, a laser beam enters from the penetrating hole 63, a sample (not shown) in the penetrating hole 62 is irradiated with the laser beam, and reflection light thereof passes through the penetrating hole 62 in an upward direction and/or a downward direction. Therefore, this reflection light can be detected by a microscope. Further, a part of the laser light beam passes through the sample and the part of the laser light beam exits through the penetrating hole 64. Therefore, the exiting part of the laser light beam may be observed. With talking refraction of the light beam into account, a diameter of the penetrating hole 64 may be larger than a diameter of the penetrating hole 63.

In Embodiment 11, the circuit board 61 is arranged in between the coils L1 and L2 in parallel, and therefore, an advantageous mechanical characteristic and an advantageous electrical characteristic are obtained from various viewpoints such as stable forming of shapes of the coils L1 and L2 and keeping a stable distance between the coils L1 and L2.

Embodiment 12

Figure 17:
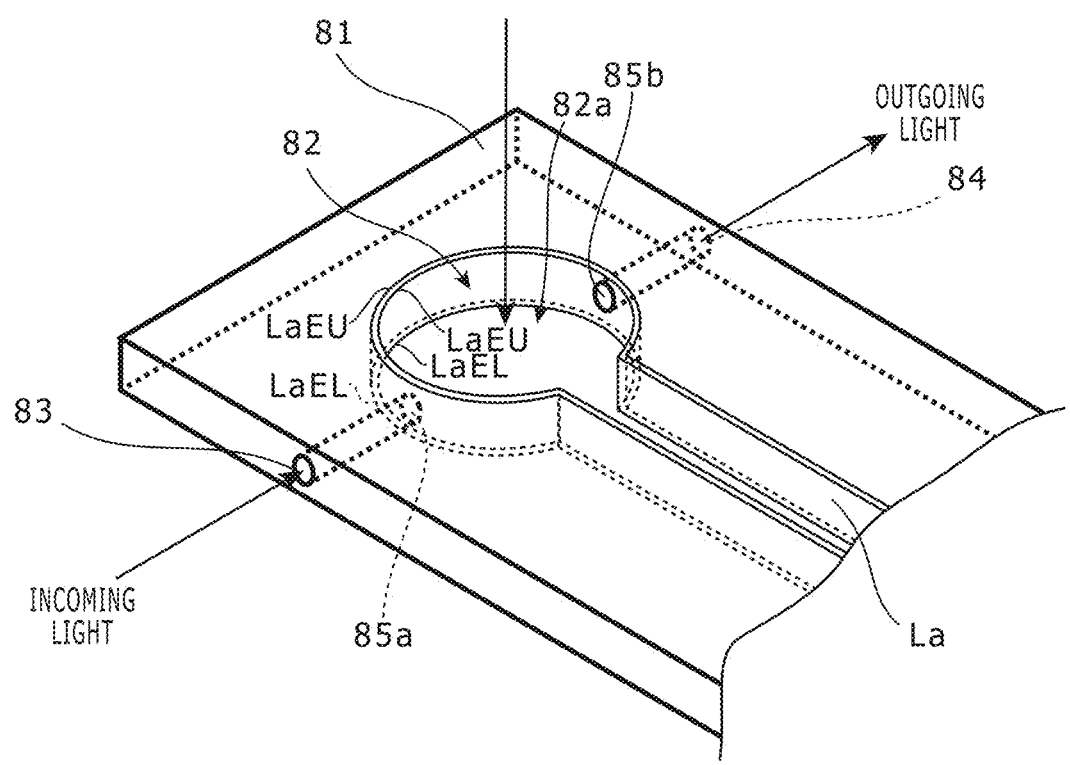
FIG. 17 shows a diagram that indicates a configuration of a high-frequency magnetic field generating device in Embodiment 12 of the present invention.

FIG. 17 shows a diagram that indicates a configuration of a high-frequency magnetic field generating device in Embodiment 12 of the present invention.

In Embodiment 12, the high-frequency magnetic field generating device includes a plate coil La instead of the aforementioned coils L1 and L2 described in Embodiment 11. A penetrating hole 82 is formed in a circuit board 81 that has a predetermined thickness. The plate coil La is arranged in the penetrating hole 82 Embodiment 12, the plate coil La is fixed on an inner wall facing the penetrating hole 82 of the circuit board 81 such that a longitudinal direction of a cross section of the plate coil La is perpendicular to the circuit board 81. The cross section of the plate coil La has a substantially rectangle shape. The penetrating hole 82 may be a through hole; and the plate coil La may be a member formed by flexing and/or bending a thin metal plate such as copper plate or may be a metal foil formed on an inner circumferential surface of the through hole as the penetrating hole 82 using metal plating or the like.

Further, in Embodiment 12, the penetrating hole 82 includes an observation hole part 82a of which a cross section has a circular shape. Among four edge line parts LaEU and LaEL (in particular, edge line parts in the observation hole part 82a) of the plate coil La, (a) one of edge line parts LaEU in a top end side and (b) one of edge line parts LaEL in a bottom end side act as two coils arranged with a predetermined gap in parallel with each other, and these two coils are arranged (a) in between which electron spin resonance material is arranged or (b) arranged at one side from electron spin resonance material. The current intensively flows at the edge line parts LaEU and LaEL of the plate coil La due to skin effect in high frequency (in particular, equal to or higher than MHz order), and therefore, the edge line part LaEU in the top end side and the edge line part LaEL in the bottom end side substantially act as individual coils. It is favorable that a height of the plate coil La (i.e. a length of a long side of the cross section) is set to be substantially equal to a radius of a circular part of the plate coil La. Further, in order to restrain stray capacitance between the plate coil La and a lens barrel of the microscope, it is favorable that a width of the plate coil La (i.e. a length of a short side of the cross section) is set to be sufficiently smaller than the height of the plate coil La.

This penetrating hole 82 enables the high-frequency alternate magnetic field to be applied to a sample not only (a) in a case that both of the edge line part LaEU in the top end side and the edge line part LaEL in the bottom end side are arranged at one side from the sample with a predetermined distance but (b) in a case that the sample is arranged at any position between the edge line part LaEU in the top end side and the edge line part LaEL in the bottom end side in the height direction.

Further, as shown in Embodiment 17, penetrating holes 83 and 84 may be formed in the wall thickness of the circuit board 81 so as to be parallel to a radius direction of the circular part of the plate coil La, and penetrating holes 85a and 85b of the plate coil La may be formed at positions on an extension line between the penetrating holes 83 and 84. In such a case, a laser beam enters from the penetrating holes 83 and 85a, a sample (not shown) in the penetrating hole 82 is irradiated with the laser beam, and reflection light thereof passes through the penetrating hole 82 in an upward direction and/or a downward direction. Therefore, this reflection light can be detected by a microscope. Further, a part of the laser light beam passes through the sample and the part of the laser light beam exits through the penetrating holes 85b and 84. Therefore, the exiting part of the laser light beam may be observed. With talking refraction of the light beam into account, diameters of the penetrating holes 85a and 84 may be larger than diameters of the penetrating holes 83 and 85a.

Other parts of configuration and behaviors of the high-frequency magnetic field generating device in Embodiment 12 are identical or similar to those in Embodiment 9 or 11 or a combination thereof, and therefore not explained here.

As mentioned, in Embodiment 12, the aforementioned plate coil La is applied and thereby a direct-current resistance of the coil gets low. If there is a metallic object such as a housing of the microscope for observation or a dielectric object such as sample base around the coil, then the resonance frequency may change due to the existence of such object, but such change of the resonance frequency is restrained by applying the aforementioned plate coil La.

For example, when the thickness of the circuit board was 1.6 mm and a radius of the circular part of the plate coil La was 2 mm, the resonance frequency in Embodiment 12 was 2.96 GHz in a status that a sample was arranged in the penetrating hole 82 or 2.965 GHz in a status that a lens of the microscope was arranged at the distance of 1.5 mm. Contrarily, in a comparative example, the resonance frequency was 2.84 GHz in a status that a sample was arranged in the penetrating hole or 2.89 GHz in a status that a lens of the microscope was arranged at the distance of 1.5 mm. Thus, the change of the resonance frequency is restrained.

Embodiment 13

Figure 18:
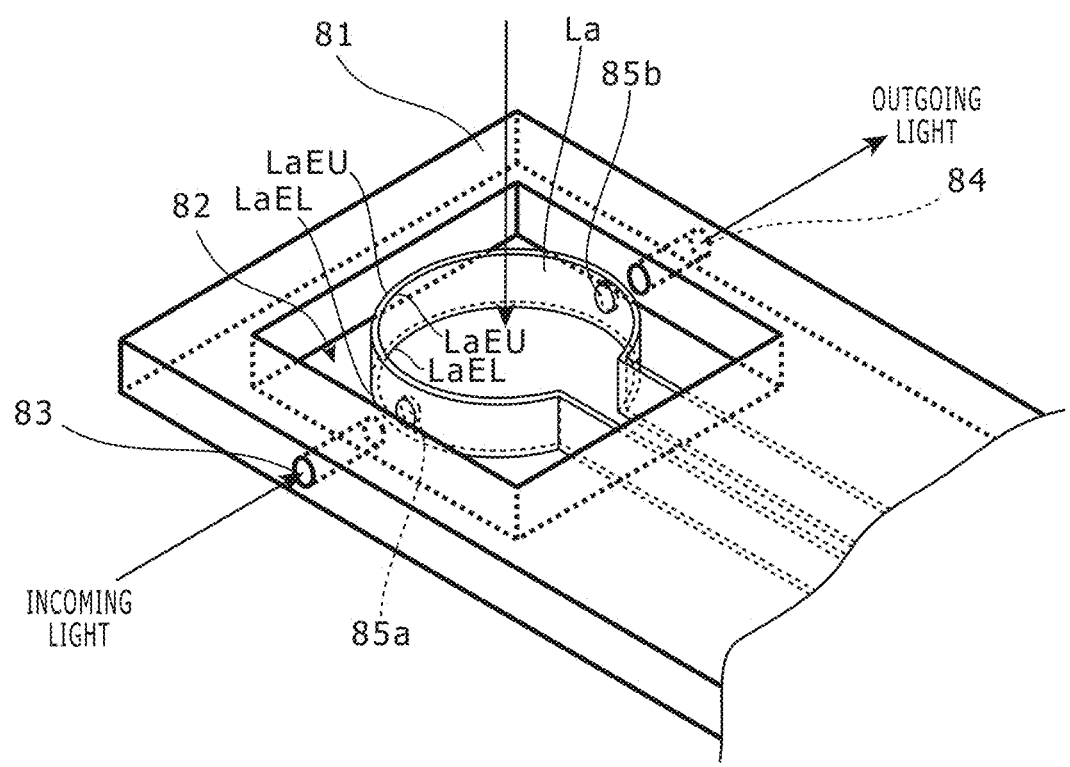
FIG. 18 shows a diagram that indicates a configuration of a high-frequency magnetic field generating device in Embodiment 13 of the present invention.

FIG. 18 shows a diagram that indicates a configuration of a high-frequency magnetic field generating device in Embodiment 13 of the present invention.

In Embodiment 13, the penetrating hole 82 has a substantially rectangular shape, and the plate coil La is arranged in the penetrating hole 82.

In Embodiment 13, the plate coil La is fixed such that the plate coil La protrudes from an inner wall facing the penetrating hole 82 of the circuit board 81.

Other parts of configuration and behaviors of the high-frequency magnetic field generating device in Embodiment 13 are identical or similar to those in Embodiment 12, and therefore not explained here.

In addition, about various changes for the form of the above-mentioned enforcement and the correction, it is apparent to these skilled in the art. Such a change and the correction may be performed without leaving the purpose of the subject and the range and without weakening an advantage aimed at. In other words such a change and a correction intend to be within the range of the request.

For example, in any of the aforementioned embodiments, the ends of the aforementioned two line units may be neither open-circuited nor short-circuited, and may be terminated with a predetermined resistance value.

Further, in Embodiment 4, the coils L11 and L21 may be removed and the line units S11 and S21 may be connected to each other, and the high-frequency power supply 1 may be connected to a connecting point between the line units S11 and S21.

Furthermore, in any of the aforementioned embodiments, the line unit is used as the transmission line unit. Alternatively, the aforementioned line unit may be replaced with a lumped constant circuit if required.

Furthermore, in any of the aforementioned embodiments, a diamond including an NVC is described as an example of the ODMR material. Alternatively, the ODMR material including another color center (e.g. SiC color center or color center of ZnO, GaN, Si, an organic substance or the like) may be used. In such a case, the high-frequency power supply 1 generates microwave current having a frequency corresponding to the color center in use.

Figure 19:
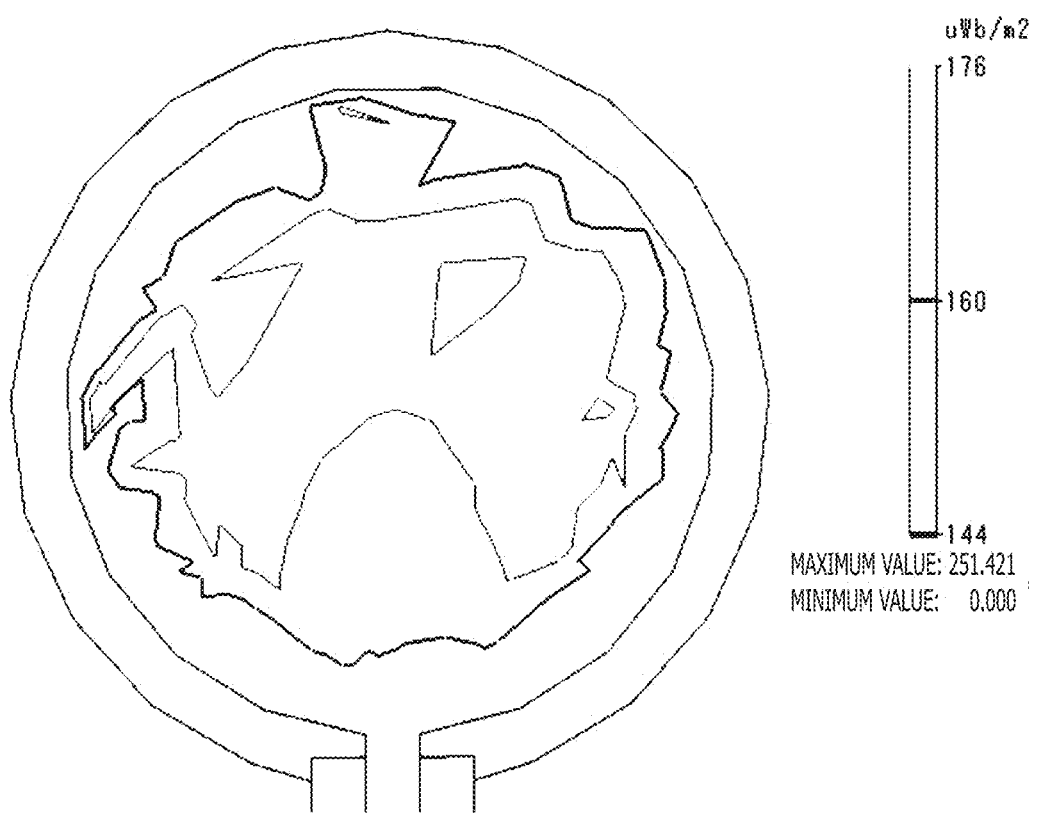
FIG. 19 shows a diagram that indicates a result of a simulation of a magnetic field emitted from the high-frequency magnetic field generating device in Embodiment 6 of the present invention.
Figure 20:
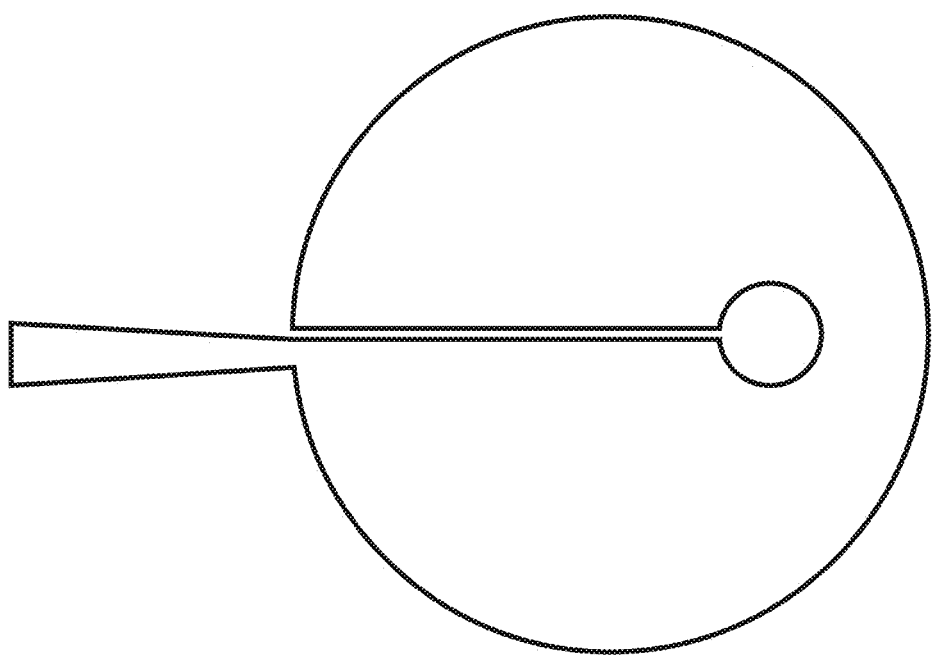
FIG. 20 shows a circuit diagram that indicates a configuration of an ordinary coil-type high-frequency generating device.
Figure 21:
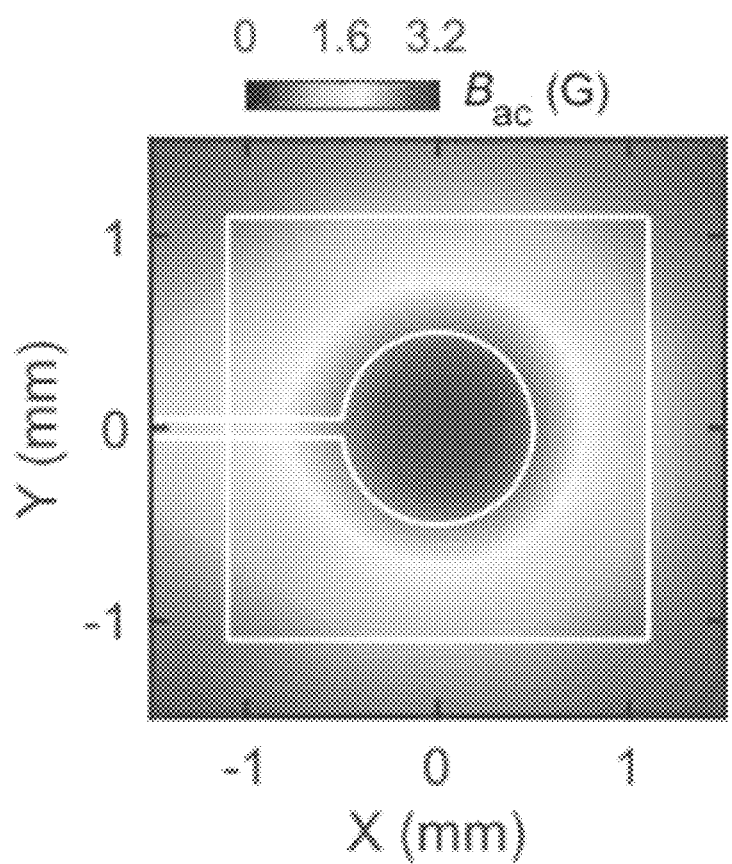
FIG. 21 shows a diagram that indicates a magnetic field emitted from an ordinary coil-type high-frequency generating device.

Furthermore, in any of the aforementioned embodiments, the high-frequency magnetic field generating device can form a uniform magnetic field in an area substantially identical to an opening area of the coil. Therefore, in particular, the high-frequency magnetic field generating device is applied to ODMR in a high frequency range equal to or higher than 100 MHz, and in addition, the high-frequency magnetic field generating device may be applied to another measurement using electron spin resonance, such as EDMR. FIG. 19 shows a diagram that indicates a result of a simulation of a magnetic field emitted from the high-frequency magnetic field generating device in Embodiment 6 of the present invention. This simulation is performed under a condition that current of about 3 GHz is supplied from a power supply to the coil L1 and L2, and the result shows that as shown in FIG. 19, a uniform magnetic field (for example, a magnetic field area that has an error of 10 percent or less of the value of the magnetic field intensity at the center) are generated in a substantially whole area of the opening area from the center of the circular part of the coils L1 and L2

Further, even in a range less than 100 MHz, a high-frequency magnetic field generating device in each embodiment of the present invention can be used as well as an ordinary coil-type resonator.

INDUSTRIAL APPLICABILITY

For example, the present invention is applicable to a high-frequency magnetic field generating device for Optically Detected Magnetic Resonance.

What is claimed is:

1. A high-frequency magnetic field generating device, comprising:
   two coils arranged with a predetermined gap in parallel with each other, the two coils (a) in between which electron spin resonance material is arranged or (b) arranged at one side from electron spin resonance material;
   a high-frequency power supply that generates microwave current that flows in the two coils; and
   a transmission line part connected to the two coils, that sets a current distribution so as to locate the two coils at positions other than a node of a stationary wave,
   wherein:
   the transmission line part is two transmission lines;
   the two transmission lines are connected to the two coils, respectively;
   one-side ends of the two transmission lines are open-circuited or are connected to a high impedance circuit for a frequency of the microwave current;
   other-side ends of the two transmission lines are connected to one-side ends of the two coils; and
   the microwave current from the high-frequency power supply flows into other-side ends of the two coils.

2. The high-frequency magnetic field generating device according to claim 1, further comprising an impedance matching unit in between (a) the high-frequency power supply and (b) the two coils or the transmission line part.

3. The high-frequency magnetic field generating device according to claim 1, further comprising a circuit board;
   wherein the two coils are arranged on one surface of the circuit board; and
   the transmission line part is line members that have partially-cutted-off ring shapes and are arranged on the other surface of the circuit board.

4. The high-frequency magnetic field generating device according to claim 1, further comprising a circuit board;
   wherein the transmission line part is a wiring pattern on the circuit board.

* * * * *